US012444575B2

(12) United States Patent
Tamura et al.

(10) Patent No.: US 12,444,575 B2
(45) Date of Patent: Oct. 14, 2025

(54) PLASMA PROCESSING APPARATUS

(71) Applicant: Hitachi High-Tech Corporation, Tokyo (JP)

(72) Inventors: Hitoshi Tamura, Tokyo (JP); Norihiko Ikeda, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 0 days.

(21) Appl. No.: 18/691,299

(22) PCT Filed: Jul. 24, 2023

(86) PCT No.: PCT/JP2023/026919
§ 371 (c)(1),
(2) Date: Mar. 12, 2024

(87) PCT Pub. No.: WO2024/084762
PCT Pub. Date: Apr. 25, 2024

(65) Prior Publication Data
US 2025/0246410 A1 Jul. 31, 2025

(30) Foreign Application Priority Data
Oct. 19, 2022 (JP) ................................ 2022-167445

(51) Int. Cl.
*H01J 37/32* (2006.01)

(52) U.S. Cl.
CPC .. *H01J 37/32229* (2013.01); *H01J 37/32247* (2013.01)

(58) Field of Classification Search
CPC ...................... H01J 37/32229; H01J 37/32247
See application file for complete search history.

(56) References Cited

U.S. PATENT DOCUMENTS 2,716,221 A 8/1955 Allen
5,230,740 A 7/1993 Pinneo
(Continued)

FOREIGN PATENT DOCUMENTS

DE 19802971 C2 * 12/1999 ........ H01J 37/32247
JP 2569019 B2 * 1/1997 ........ H01J 37/32247
(Continued)

OTHER PUBLICATIONS

Search Report mailed Sep. 5, 2023 in International Application No. PCT/JP2023/026919.
(Continued)

*Primary Examiner* — Adam D Houston
(74) *Attorney, Agent, or Firm* — Miles & Stockbridge, P.C.

(57) ABSTRACT

A plasma processing apparatus including a processing chamber including therein a sample stage on which a substrate to be processed is placed; a magnetic field generating unit configured to generate a magnetic field inside the processing chamber; a microwave power source configured to generate microwave power; microwave power transfer units configured to transfer the microwave power; and a microwave three-dimensional circuit unit configured to supply the transferred microwave power into a processing chamber via a dielectric window. The microwave three-dimensional circuit unit includes a branch circuit configured to branch the microwave power transferred by the microwave power transfer unit in a plurality of azimuth directions, a ring resonator configured to resonate the microwave power branched in the plurality of azimuth directions by the branch circuit, and a coaxial line configured to supply the microwave power resonated by the ring resonator into the processing chamber via the dielectric window.

5 Claims, 4 Drawing Sheets

(56) References Cited

U.S. PATENT DOCUMENTS

| | | | | |
|---|---|---|---|---|
| 5,276,386 | A | 1/1994 | Watanabe et al. | |
| 5,359,177 | A * | 10/1994 | Taki | H01J 37/32192 219/121.52 |
| 5,517,085 | A * | 5/1996 | Engemann | H05H 1/46 315/111.41 |
| 6,158,383 | A | 12/2000 | Watanabe et al. | |
| 6,652,709 | B1 | 11/2003 | Suzuki et al. | |
| 8,075,733 | B2 | 12/2011 | Watanabe et al. | |
| 8,969,768 | B2 * | 3/2015 | Kotzian | H05B 6/806 219/690 |
| 9,506,142 | B2 * | 11/2016 | Sasai | C23C 14/357 |
| 2001/0011525 | A1 | 8/2001 | Ishii | |
| 2002/0008088 | A1 | 1/2002 | Suzuki et al. | |
| 2004/0244693 | A1 | 12/2004 | Ishii et al. | |
| 2023/0352274 | A1 | 11/2023 | Hitoshi et al. | |

FOREIGN PATENT DOCUMENTS

| | | | | |
|---|---|---|---|---|
| JP | H09-270386 | A | 10/1997 | |
| JP | 2007-035411 | A | 2/2007 | |
| JP | 2007-035412 | A | 2/2007 | |
| JP | 2012-044035 | A | 3/2012 | |
| JP | 2012-049353 | A | 3/2012 | |
| JP | 2012156275 | A * | 8/2012 | |
| JP | 2012-190899 | A | 10/2012 | |
| JP | 2019-110047 | A | 7/2019 | |
| JP | 7139528 | B2 | 9/2022 | |
| KR | 10-2004-0047850 | A | 6/2004 | |
| KR | 102820386 | B1 * | 6/2025 | H01J 37/32669 |
| WO | WO-2021152655 | A1 * | 8/2021 | H01J 37/32678 |
| WO | WO-2021220551 | A1 * | 11/2021 | H01J 37/3222 |
| WO | WO-2022176147 | A1 * | 8/2022 | H01J 37/32229 |
| WO | WO-2024084762 | A1 * | 4/2024 | H01J 37/32311 |

OTHER PUBLICATIONS

Office Action mailed Apr. 4, 2023 in Korean Application No. 10-2021-7016706.

Office Action mailed Feb. 22, 2024 in U.S. Appl. No. 17/433,693.

Search Report mailed Jan. 26, 2021 in International Application No. PCT/JP2020/048422.

Written Opinion mailed Sep. 5, 2023 in International Application No. PCT/JP2023/026919.

* cited by examiner

[FIG. 1]
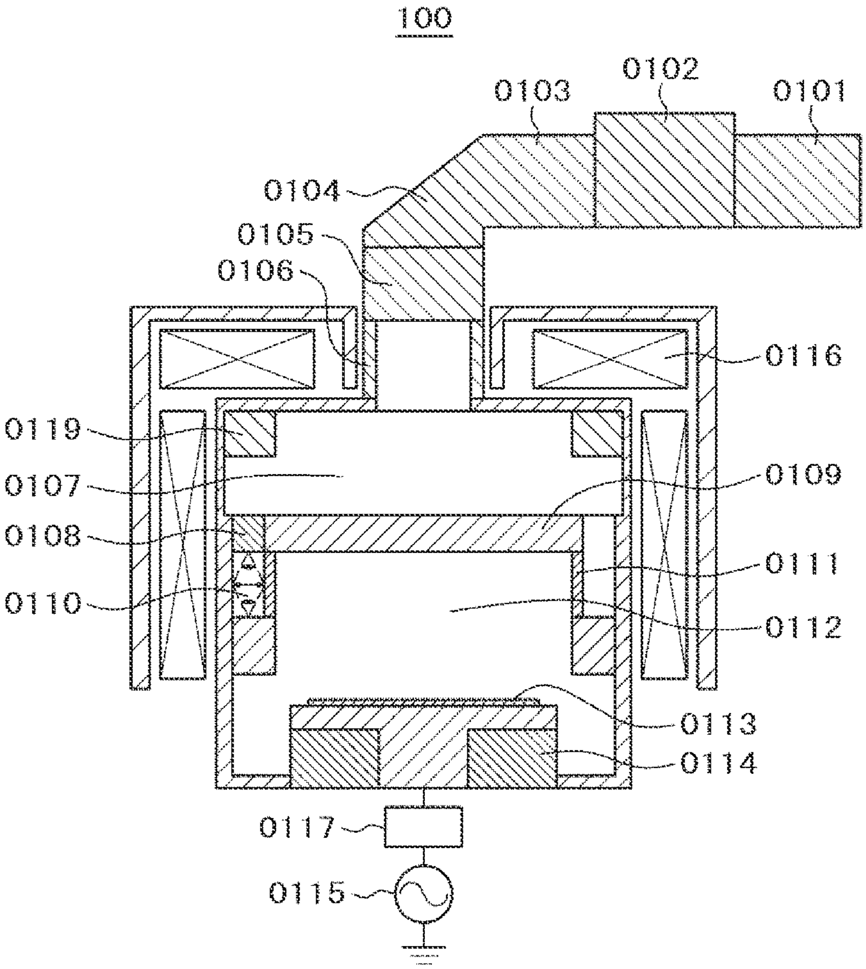

[FIG. 2]
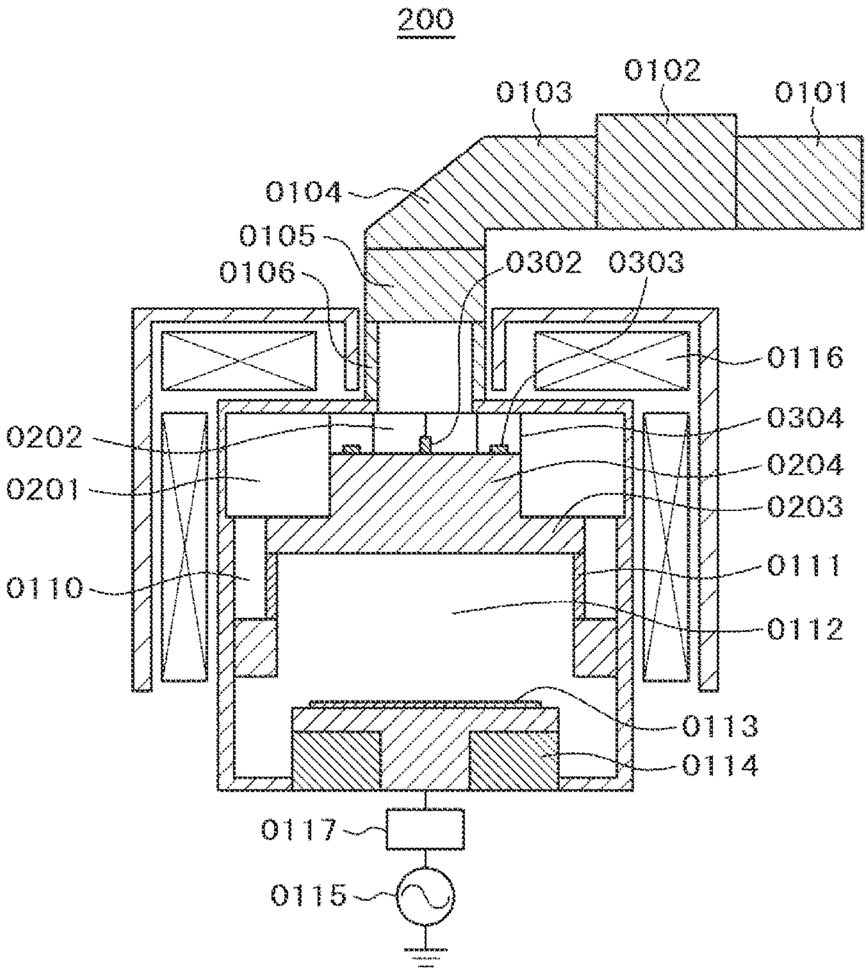
[FIG. 3A]
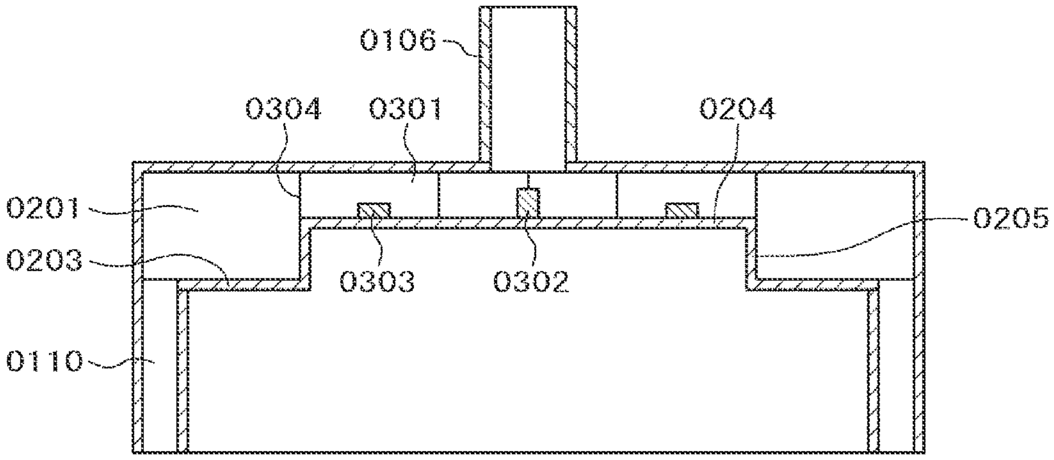

[FIG. 3B]
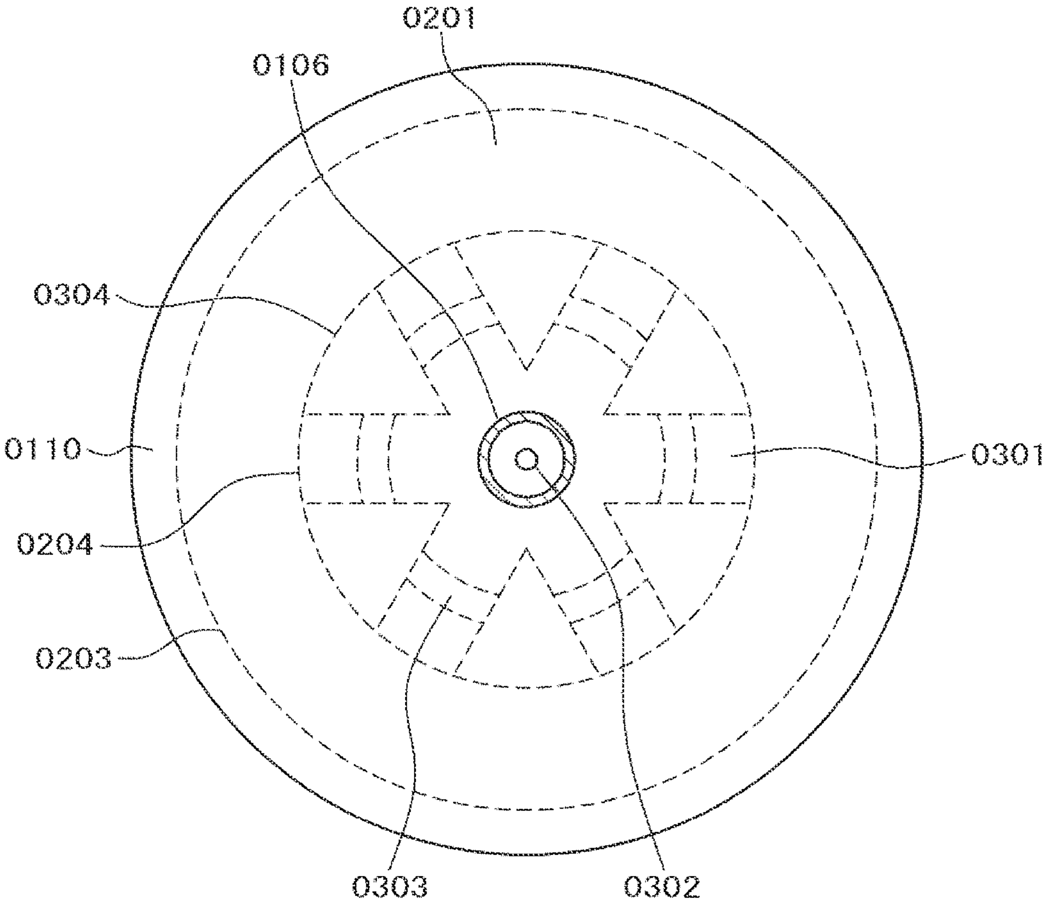
[FIG. 4A]
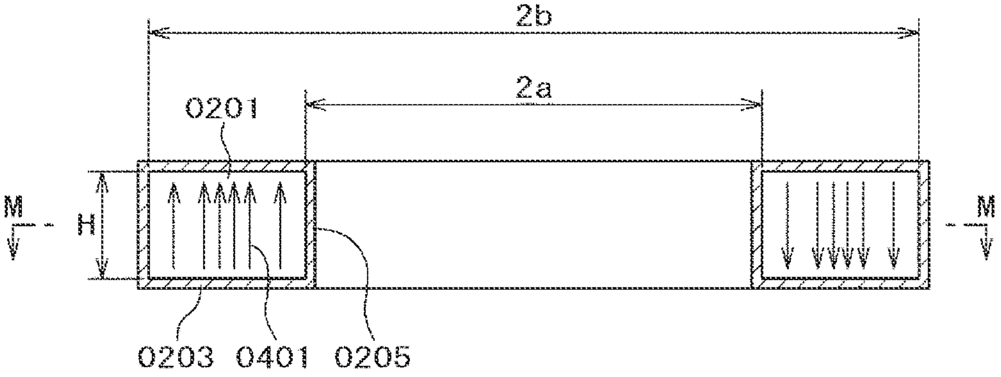

[FIG. 4B]
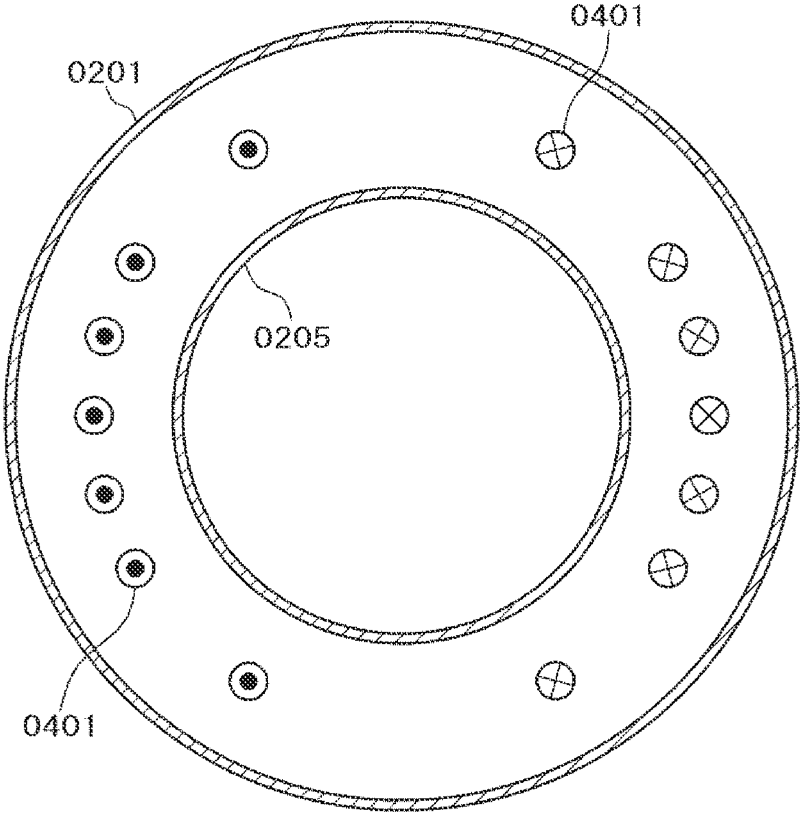

PLASMA PROCESSING APPARATUS

TECHNICAL FIELD

The present invention relates to a plasma processing apparatus that generates plasma by using interaction between a microwave and a static magnetic field, and more particularly, to an apparatus in which a static magnetic field and a microwave three-dimensional circuit system are formed such that a traveling direction of the microwave in a plasma processing chamber is substantially perpendicular to a direction of the static magnetic field and a direction of an electric field of the microwave is substantially perpendicular to the direction of the static magnetic field, and the microwave three-dimensional circuit system is optimized from the viewpoint of a plasma density distribution in the processing chamber.

BACKGROUND ART

A plasma processing apparatus is used to manufacture a semiconductor integrated circuit device. In order to improve performance of the device and reduce a cost, miniaturization of the device has progressed. In the related art, due to two-dimensional miniaturization of the device, the number of devices that can be manufactured from one substrate to be processed is increased, a manufacturing cost per device is reduced, and the performance has also been improved by miniaturization effects such as shortening of wiring lengths. However, when a size of the semiconductor device is on an order of nanometers close to a size of an atom, difficulty of the two-dimensional miniaturization is remarkably increased, and measures such as application of a new material or a three-dimensional device structure are taken. Due to such a structural change, a degree of difficulty of manufacturing increases, the number of manufacturing processes increases, and an increase in the manufacturing cost becomes a serious problem.

When minute particles or contaminants adhere to the semiconductor integrated circuit device being manufactured, a fatal defect is formed, and thus, the semiconductor integrated circuit device is manufactured in a clean room in which particles and contaminants are removed and temperatures and humidity are optimally controlled. With the miniaturization of devices, cleanliness of the clean room required for manufacturing increases, and an enormous cost is required for construction and maintenance of the clean room. Therefore, it is required to efficiently use and manufacture a clean room space. From this viewpoint, miniaturization and cost reduction of a semiconductor manufacturing apparatus are strictly required.

Further, in-plane uniformity of plasma processing performed on the substrate to be processed is also important. A disk-shaped silicon wafer having a diameter of 300 mm is often used as the substrate to be processed for manufacturing the semiconductor integrated circuit device. A large number of semiconductor integrated circuit devices are often formed on the silicon wafer, but when the in-plane uniformity of the plasma processing is poor, the number of good products satisfying specifications obtainable from one silicon wafer may be reduced. Similarly, stability of the plasma processing for each substrate to be processed is also important. When quality of the plasma processing is not stable and, for example, the quality changes with time, a proportion of the good products may accordingly decrease.

As a plasma processing apparatus that generates plasma by electromagnetic waves, an apparatus using microwaves having a frequency of about several GHz, typically 2.45 GHz, as the electromagnetic waves is widely used. In particular, there is an apparatus that uses an electron cyclotron resonance (hereinafter referred to as ECR) phenomenon that occurs by combining a microwave and a static magnetic field, and this apparatus has excellent characteristics such as being able to generate plasma relatively stably even under conditions such as an extremely low pressure under which plasma generation is usually difficult, and being able to control a distribution of plasma by controlling a distribution of the static magnetic field.

A phenomenon called upper hybrid resonance (hereinafter referred to as UHR) is also known as the interaction between the microwave and the static magnetic field. In the phenomenon, a microwave, which propagates in a direction perpendicular to the static magnetic field and has a microwave electric field perpendicular to the static magnetic field (referred to as an X wave), resonates with electrons in the plasma, and energy of the microwave is strongly absorbed by the electrons. It is known that the UHR is generated in a static magnetic field weaker than that in the ECR. Although there are few known examples of plasma processing apparatuses that actively utilize this phenomenon, there are the following inventions as examples in the related art.

CITATION LIST

Patent Literature

PTL 1: JP2019-110047A

SUMMARY OF INVENTION

Technical Problem

In PTL 1, a static magnetic field is applied substantially parallel to a center axis direction of a substantially cylindrical processing chamber, and a microwave is applied from a side surface. Further, an electric field of the microwave is substantially perpendicular to the center axis direction of the processing chamber. According to these measures, the UHR is utilized by exciting the X wave in the plasma in the processing chamber. Further, an electrode for installing a substrate to be processed is provided on one surface of the processing chamber which is substantially perpendicular to the static magnetic field, and an earth electrode (referred to as an opposite earth) is provided on the other surface. Accordingly, RF bias to be described later can be efficiently applied to the substrate to be processed. As compared with an apparatus using the ECR, since resonance can be caused by a weak static magnetic field, there are advantages that power consumption caused by an electromagnet for generating the static magnetic field can be reduced, a size of the electromagnet can be reduced, and a degree of freedom of arrangement increases.

Further, in PTL 1, the opposite earth is held by a plurality of support cylinders, and the microwave is efficiently applied into the processing chamber by a three-dimensional circuit system for microwaves having a structure for preventing reflection of the microwave caused by a discontinuous portion such as the support cylinders.

In the plasma processing apparatus using the microwave, a magnetron is widely used as a microwave oscillator, but recently, oscillators using solid-state devices have also come into use. The oscillator using the solid-state device has advantages in that an oscillation frequency and an output are more stable than those of the magnetron and various kinds of modulation can be easily applied. Further, a rectangular waveguide, a circular waveguide, a coaxial line, or the like is used to transmit microwave power. In addition, an isolator for protecting the microwave oscillator and an automatic matcher for preventing impedance mismatch with a load are often used in combination.

Further, the quality of the plasma processing can be improved by applying RF bias power to the substrate to be processed. For example, in the case of a plasma etching process, a DC bias voltage caused by a mass difference between ions and electrons is generated on the substrate to be processed by RF bias having a frequency of about 400 kHz to 13.56 MHz, ions are drawn in the plasma using this DC bias voltage, and perpendicularity of a processed shape and a processing speed are improved, so that the quality of the plasma processing can be improved.

Generally, when there is a discontinuous portion in a transmission path of the microwave, a reflected wave is generated. Even in a structure in which the microwave is applied into the plasma processing chamber, for example, when the circular waveguide is expanded stepwise, the reflected wave is generated due to the expansion. When a structure for implementing an optimum electromagnetic field distribution from the viewpoint of the uniformity of the plasma in the plasma processing chamber is complicated, the microwave power may not be efficiently transmitted into the processing chamber due to an influence of the reflected wave generated in each portion. Therefore, it is desirable to simplify the structure as much as possible, but it is often difficult to achieve a desired electromagnetic field at the same time. The above-described matcher is used as a measure, and when a degree of mismatch with the load is too large, it may be difficult to ensure a wide matching range corresponding to the degree of mismatch, and a large standing wave may be generated between the matcher and the load, which may cause problems such as abnormal discharge or power loss.

When the embodiment disclosed in PTL 1 is applied, it has been found that the plasma may be excessively localized near a sidewall portion of the processing chamber depending on a plasma generation condition, and the plasma density near the substrate to be processed may decrease. As a result of investigation of the cause, the present inventors have found that the cause is that a proportion of an intended propagation mode of the microwave may be low and a proportion of a high-order mode changing many times in an azimuth direction may be large. It has been found that in the intended propagation mode of the microwave, the number of changes in azimuth direction (referred to as m) is 1, but many high-order modes such as m=5 may be generated due to the influence of the plurality of support cylinders used for holding the opposite earth.

In order to further improve the uniformity of the plasma density in the plasma processing chamber, it is necessary to increase the proportion of the mode of m=1 by devising the structure of the microwave three-dimensional circuit and to reduce the proportion of the high-order mode in which m is large.

An object of the invention is to provide a plasma processing apparatus capable of solving the above problem in the related art and further improving uniformity of plasma in a processing chamber.

Solution to Problem

In order to solve the above problems, the invention provides a plasma processing apparatus including: a processing chamber including therein a sample stage on which a substrate to be processed is placed; a magnetic field generating unit configured to generate a magnetic field inside the processing chamber; a microwave power source configured to generate microwave power; a microwave power transfer unit configured to transfer the microwave power generated by the microwave power source; and a microwave three-dimensional circuit unit configured to supply the microwave power transferred by the microwave power transfer unit into a processing chamber via a dielectric window. The microwave three-dimensional circuit unit includes a branch circuit unit configured to branch the microwave power transferred by the microwave power transfer unit in a plurality of azimuth directions, a ring resonator disposed around the branch circuit unit and configured to resonate the microwave power branched in the plurality of azimuth directions by the branch circuit unit, and a coaxial line unit connected to the ring resonator and configured to supply the microwave power resonated by the ring resonator into the processing chamber via the dielectric window.

Advantageous Effects of Invention

According to the invention, by using a microwave three-dimensional circuit unit having the above configuration, it is possible to excite a microwave of m=1 in a coaxial line and a plasma processing chamber, and uniformity of plasma inside the processing chamber is further improved as compared with the related art.

BRIEF DESCRIPTION OF DRAWINGS

FIG. 1 is a front cross-sectional view showing a schematic configuration of a microwave plasma etching apparatus in the related art.

FIG. 2 is a front cross-sectional view showing a schematic configuration of a microwave plasma etching apparatus according to an embodiment of the invention.

FIG. 3A is a longitudinal sectional view showing a microwave three-dimensional circuit of the microwave plasma etching apparatus according to the embodiment of the invention.

FIG. 3B is a plan view showing the microwave three-dimensional circuit of the microwave plasma etching apparatus according to the embodiment of the invention.

FIG. 4A is a front cross-sectional view of a ring resonator of a microwave plasma etching apparatus according to the embodiment of the invention, showing an electric field distribution of the ring resonator.

FIG. 4B is a cross-sectional view of the ring resonator of the microwave plasma etching apparatus according to the embodiment of the invention taken along a line M-M in FIG. 4A, showing the electric field distribution of the ring resonator.

DESCRIPTION OF EMBODIMENTS

The invention provides a plasma processing apparatus which includes a substantially cylindrical plasma processing chamber and generates plasma by applying microwave power from a side surface of the plasma processing chamber. A problem that a plasma density near a center axis of the plasma processing chamber may be lowered due to a proportion of the microwave power traveling in a radial direction of a microwave being small and the generated plasma being excessively localized near an inner wall of the side surface of the plasma processing apparatus is solved by applying the microwave into the processing chamber using a ring resonator which resonates in a mode in which a value of an azimuth direction dependency m is 1 so as to prevent the microwave from traveling in an azimuth direction and increase a component traveling in the radial direction. Therefore, a plasma processing apparatus with further improved uniformity of plasma in the plasma processing chamber is implemented.

Further, in the plasma processing apparatus in the related art described above, the plasma may be excessively localized near the sidewall portion of the processing chamber depending on the plasma generation condition, and the plasma density near the substrate to be processed may decrease. In contrast, in the invention, a structure of the microwave three-dimensional circuit is devised to increase the proportion of the mode of m=1 and reduce the proportion of the high-order mode in which m is large. Accordingly, in the invention, a plasma processing apparatus capable of solving the problem in the related art and further improving the uniformity of the plasma in the processing chamber is implemented.

A configuration of the plasma processing apparatus in the related art disclosed in embodiments of PTL 1 will be described with reference to FIG. 1. This related art provides a plasma processing apparatus 100 that performs an etching process. A microwave having a frequency of 2.45 GHz generated from a microwave source 0101 is transmitted to a circular waveguide 0106 via an isolator (not shown), an automatic matcher 0102, a rectangular waveguide 0103, and a circular rectangular converter 0104 serving as a corner for changing a transmission direction by 90 degrees. A circular polarization generator 0105 is loaded in the circular waveguide 0106. The circular polarization generator 0105 has a function of converting incident microwave as a linear polarized wave into a circularly polarized wave. By converting the microwave into the circularly polarized wave, it is possible to generate uniform plasma in the azimuth direction. Further, the microwave is transmitted to a coaxial line 0110 via an expansion unit 0107. A microwave electric field distribution in the coaxial line 0110 is schematically indicated by an arrow.

A lower portion of the expansion unit 0107 is provided with an opposite earth 0109 fixed to the outside via a plurality of support cylinders 0108. A cylindrical microwave introduction window 0111 is provided below the opposite earth 0109 and on an inner side of the coaxial line 0110. It is desirable that a material of the microwave introduction window has a small loss with respect to the microwave, has plasma resistance, and does not have a negative influence on plasma processing, and quartz is used.

A ring-shaped matching member 0119 is disposed at a portion in contact with a ceiling wall and a side wall in an outer peripheral portion inside the expansion unit 0107.

A vicinity of a region formed by the opposite earth 0109 and the microwave introduction window 0111 is a plasma processing chamber 0112. A substrate electrode 0114 for disposing a substrate to be processed 0113 having a diameter of 300 mm is provided in the plasma processing chamber 0112. An RF power supply 0115 is connected to the substrate electrode 0114 via an automatic matcher 0117, and RF bias can be applied to the substrate to be processed 0113. As the RF power supply 0115, an RF power supply having an oscillation frequency of 400 kHz is used. Further, a multi-stage solenoid coil 0116 including a yoke is provided around the mechanisms, and a static magnetic field can be applied into the plasma processing chamber 0112.

The substrate to be processed 0113 has a disk shape, and a corresponding apparatus basically has an axisymmetric structure sharing axis with a center axis of the substrate to be processed 0113. That is, the substrate electrode 0114, the coaxial line 0110, the opposite earth 0109, the expansion unit 0107, the circular waveguide 0106, and the solenoid coil 0116 are disposed coaxially with a center axis of the substantially cylindrical plasma processing chamber 0112.

In addition, a gas supply system and a vacuum exhaust system (not shown) are connected to the plasma processing chamber 0112, and a processing gas can be supplied and exhausted at a predetermined flow rate while maintaining a predetermined pressure.

The opposite earth 0109 needs to be fixed to an external structure, and has a built-in temperature adjustment mechanism for cooling and a built-in gas supply mechanism from an opposite earth portion, and is fixed to the outside by the plurality of support cylinders 0108. A flow path of a coolant or a gas is provided in the support cylinders 0108. Further, the opposite earth 0109 is electrically connected to the outside via the support cylinders 0108, and a potential can be stabilized.

It has been found that when an experiment is performed in the plasma processing apparatus 100 according to the example in the related art shown in FIG. 1, the plasma generated in the plasma processing chamber 0112 may be mainly excessively localized near an inner surface of the microwave introduction window 0111, and a density near of the center axis of the processing chamber may decrease. Therefore, a processing speed of the plasma etching process performed on the substrate to be processed 0113 may be slow.

The inventors have studied the cause of this, and found that this is because the applied microwave travels mainly in the azimuth direction and the proportion of the component traveling in the radial direction is small. Further, it has been found that a main cause of the microwave traveling in the azimuth direction is the plurality of support cylinders 0108 holding the opposite earth 0109. It has been found the support cylinders 0108 support the opposite earth 0109 from the side surface in the radial direction, and under this influence, a component having a large azimuth direction dependency m is excited.

In general, a microwave propagating in a form of a plane wave in a vacuum without a boundary propagates at a speed of light, and a wavelength of the wave in the traveling direction has a value obtained by dividing the speed of light by a frequency. When a complete conductor surface is in a space, the microwave is reflected so as to satisfy a boundary condition that an electric field vector is perpendicular to the complete conductor surface. In the three-dimensional circuit system for microwaves including a waveguide and the like, analysis can be performed with an inner wall of the waveguide as a complete conductor, reflection on the inner wall is repeated so as to satisfy the boundary condition, and respective waves are superimposed on one another to determine an electromagnetic field distribution.

In the ring resonator, similar to the above, reflection is repeated on an inner wall, and an internal microwave electromagnetic field is determined. The traveling direction of the wave can be evaluated by a wave number vector, which has respective components of a radius (r) direction, an azimuth (θ) direction, and a height (z) direction when considered in a cylindrical coordinate system (r, θ, z). In a $TM_{110}$-mode ring resonator to be described later, the wave number vector has a z component of zero, propagates in the radial direction and the azimuth direction, and does not propagate in the height direction. The azimuth direction dependency m indicates that waves having m wavelengths are present in one round (360 degrees) in the azimuth direction, and m=1 indicates a change of one period in the azimuth direction.

Based on the above consideration, a structure of a microwave three-dimensional circuit in which a component having a small azimuth direction dependency m is excited in a processing chamber has been examined. However, considering that a lowest-order mode of the circular waveguide 0106 used for applying the microwave into the plasma processing chamber 0112 is m=1, a structure for exciting a microwave electromagnetic field of m=1 in the processing chamber has been examined.

FIG. 2 shows a configuration of a plasma processing apparatus 200 according to the present embodiment based on the examination result, and a partial detailed configuration thereof will be described with reference to FIGS. 3A to 4B.

The configuration of the plasma processing apparatus 200 according to the present embodiment shown in FIG. 2 is different from that of the plasma processing apparatus 100 in the related art shown in FIG. 1 in a microwave three-dimensional circuit portion including a branch circuit 0202 for applying microwave power into the plasma processing chamber 0112, a ring resonator 0201, the coaxial line 0110, and an opposite earth 0203 having a convex portion 0204 formed at a center. A matching rod 0302, a matching ridge 0303, and a phase adjusting unit 0304 forming the branch circuit 0202 will be described with reference to FIGS. 3A and 3B. The other components denoted by the same reference numerals as those in FIG. 1 are the same as those in the plasma processing apparatus 100 in the related art described with reference to FIG. 1, and descriptions of parts common to the present embodiment will be omitted.

In the configuration of the plasma processing apparatus 200 according to the present embodiment shown in FIG. 2, the microwave circularly polarized by the circular polarization generator 0105 and transmitted by the circular waveguide 0106 is branched by the branch circuit 0202 formed on upper surface of the convex portion 0204 of the opposite earth 0203 right below the circular waveguide 0106, and excites the ring resonator 0201 formed around a side surface of the convex portion 0204 of the opposite earth 0203. Further, the coaxial line 0110 is connected to the ring resonator 0201 and the microwave is applied into the plasma processing chamber 0112 via the microwave introduction window 0111.

Details of the branch circuit 0202 and a periphery thereof will be described with reference to FIGS. 3A and 3B. FIG. 3A is a side sectional view, and FIG. 3B is a plan view. The branch circuit 0202 has a role of transmitting the microwave transmitted from the circular waveguide 0106 to the ring resonator 0201, and includes a six-branched rectangular waveguide 0301 by the phase adjusting unit 0304, the matching rod (first matching unit) 0302 for preventing a reflected wave at branch portions between the circular waveguide 0106 and the rectangular waveguide 0301, and the matching ridge (second matching unit) 0303 for preventing reflection due to a connection surface with the ring resonator 0201.

The rectangular waveguide 0301 is disposed so as to be equally branched at an interval of 60 degrees in the azimuth direction by six phase adjusting units 0304, and the microwave power is branched in six directions. The number of branches may be an integer of 3 or more. The rectangular waveguide 0301 has dimensions that operate in a $TE_{10}$ mode, which is a lowest-order mode of the rectangular waveguide.

The matching rod 0302 has a cylindrical shape disposed coaxially with the circular waveguide 0106, and a diameter and a height thereof are optimized, so that it is possible to prevent the reflected wave at connection surfaces between the circular waveguide 0106 and a plurality of rectangular waveguides 0301. Similarly, a position, a height, and a width of the matching ridge 0303 can be adjusted to prevent the reflected wave caused by a discontinuous surface after the rectangular waveguide 0301.

By optimally adjusting shape parameters of the matching rod 0302 and the matching ridge 0303, the microwave power incident from the circular waveguide 0106 can be efficiently transmitted into the processing chamber. However, when the reflection of the microwave is allowable, the matching rod 0302 and the matching ridge 0303 may be omitted.

The microwave introduction window 0111 as described in FIG. 2 is mounted on an inner peripheral side of the coaxial line 0110 connected to the ring resonator 0201, and a lower surface of the coaxial line 0110 is closed, but in FIG. 3A, the microwave introduction window 0111 is not shown, and the lower surface of the coaxial line 0110 is shown in an open state.

In general, only an electromagnetic field satisfying the boundary condition can be present inside a resonator. Therefore, a desired electromagnetic field can be obtained by using a resonator that resonates in a desired electromagnetic field. In the present embodiment, the ring resonator 0201 that resonates in an electric field distribution (referred to as a $TM_{110}$ mode) shown in FIGS. 4A and 4B is used. Accordingly, an electromagnetic field that satisfies the desired m=1 can be obtained.

FIG. 4A shows a longitudinal sectional view, and FIG. 4B shows a sectional view taken along a line M-M in FIG. 4A. The $TM_{110}$ mode can be considered as a mode in which a rectangular waveguide having a length corresponding to one wavelength operating in the lowest-order $TE_{10}$ mode is bent in a ring shape.

As shown in FIG. 4B, in one round in the azimuth direction, an electric field vector also shows a change in one round, and the mode is m=1. The wave number vector indicating the traveling direction of the wave has only components in the azimuth direction and the radial direction and does not have a component in a direction parallel to the center axis.

Therefore, a resonance condition of the $TM_{110}$-mode ring resonator does not depend on a dimension (H in FIG. 4A) in the direction parallel to the center axis, but depends only on an inner radius (a in FIG. 4A) and an outer radius (b in FIG. 4A) of the ring. Since the circular waveguide is supplied with the circularly polarized wave, the electromagnetic field in the ring resonator 0201 shown in FIGS. 4A and 4B temporally rotates in the azimuth direction.

The ring resonator that resonates in the $TM_{110}$ mode satisfies the following equation (1) in consideration of the boundary condition. Dimensions of the ring resonator can be obtained by solving the equation (1).

[Math. 1]

$$J_m(k_0a)N_m(k_0b) - J_m(k_0b)N_m(k_0a) = 0 \quad \text{(EQUATION 1)}$$

m: azimuth direction dependency (m=1)

$J_m$: m-order Bessel function $N_m$: m-order Neumann function $k_0$: wave number in free space a: inner radius of ring resonator b: outer radius of ring resonator $k_0=2\pi f/c$, f is a frequency of the microwave, and c is the speed of light.

The coaxial line 0110 is connected to a lower portion of the ring resonator 0201, and the coaxial line 0110 is excited by a microwave adjusted to a mode of m=1 in the ring resonator 0201. In the configuration disclosed in PTL 1 described above, a plurality of support cylinders are provided near a microwave incidence surface of the coaxial line unit for holding the opposite earth, and a wave having large m is generated under this influence. In the present embodiment, there is no discontinuous structure in the azimuth direction in a path from the coaxial line to the plasma processing chamber, and the distribution of m=1 in the ring resonator is maintained to excite the coaxial line. There is also no discontinuous structure in the azimuth direction in the plasma processing chamber, and the microwave can be applied into the processing chamber via the microwave introduction window in the distribution of m=1.

According to the present embodiment, by using the microwave three-dimensional circuit having the above configuration, it is possible to excite a microwave of m=1 in the coaxial line and the plasma processing chamber, and thus, the uniformity of the plasma density inside the plasma processing chamber is further improved.

Although the invention made by the present inventor has been specifically described based on the embodiment, the invention is not limited to the embodiment, and it is needless to say that various modifications can be made without departing from the gist of the invention. For example, the embodiment described above has been described in detail to facilitate understanding of the invention, and the invention is not necessarily limited to those including all the configurations described above. A part of the configuration of each embodiment may be added to, deleted from, or replaced with another configuration.

REFERENCE SIGNS LIST

0101 microwave source
0102 automatic matcher
0103 rectangular waveguide
0104 circular rectangular converter
0105 circular polarization generator
0106 circular waveguide
0107 expansion unit
0108 support cylinder
0109 opposite earth
0110 coaxial line
0111 microwave introduction window
0112 plasma processing chamber
0113 substrate to be processed
0114 substrate electrode
0115 RF power supply
0116 solenoid coil
0201 ring resonator
0202 branch circuit
0203 opposite earth
0204 convex portion
0301 six-branched rectangular waveguide
0302 matching rod
0303 matching ridge
0304 phase adjusting unit

The invention claimed is:

1. A plasma processing apparatus comprising:

a processing chamber in which a substrate to be processed is plasma processed;

a microwave power source configured to supply a microwave power to generate plasma through a waveguide;

a magnetic field generating unit configured to generate a magnetic field inside the processing chamber;

a sample stage on which the substrate to be processed is placed;

a circular waveguide configured to transmit the microwaves transmitted from the waveguide to a plurality of rectangular waveguides;

a resonator in a ring shape configured to resonate the microwaves transmitted from the plurality of rectangular waveguides;

a ground disposed below the plurality of rectangular waveguides;

a dielectric window in a cylindrical shape disposed below the ground; and a coaxial line unit configured to supply microwave power resonated by the resonator to the processing chamber through the dielectric window.

2. The plasma processing apparatus according to claim 1, wherein the ground includes a convex portion; and wherein the resonator is formed around the convex portion.

3. The plasma processing apparatus according to claim 1, wherein the plurality of rectangular waveguides are disposed so as to be equally branched in a plurality of azimuth directions by a phase adjusting unit.

4. The plasma processing apparatus according to claim 1, further comprising:

a first matching unit configured to prevent a reflected wave at a connection portion between the circular waveguide and the plurality of rectangular waveguides, and a second matching unit configured to prevent a reflected wave caused by a discontinuous surface in the transmission path from the plurality of rectangular waveguides to the processing chamber.

5. The plasma processing apparatus according to claim 1, wherein the resonator is a resonator that resonates the microwaves transmitted from the plurality of rectangular waveguides to an electric field distribution of a $TM_{110}$ mode.

* * * * *